United States Patent [19]

Clark et al.

[11] 4,389,080
[45] Jun. 21, 1983

[54] PLUG-IN CERAMIC HYBRID MODULE

[75] Inventors: Roland E. Clark; Salvatore J. DiBartolo, both of Lynchburg, Va.; Tonny L. Johansen, Stenlose, Denmark

[73] Assignee: General Electric, Lynchburg, Va.

[21] Appl. No.: 283,462

[22] Filed: Jul. 15, 1981

[51] Int. Cl.³ .......................................... H01R 13/658
[52] U.S. Cl. ............................ 339/14 R; 339/17 CF; 339/65; 339/136 M; 339/143 R; 339/176 MP
[58] Field of Search .......... 339/17 CF, 17 M, 17 LM, 339/14 R, 65, 75 MP, 136 R, 136 M, 143 R, 176 MP

[56] References Cited

U.S. PATENT DOCUMENTS

| | | | |
|---|---|---|---|
| 2,899,669 | 8/1959 | Johanson | 339/136 M |
| 3,155,446 | 11/1964 | Kowaleski et al. | 339/17 LM |
| 3,801,953 | 4/1974 | Lynch | 339/176 MP |
| 3,922,056 | 11/1975 | Murawski et al. | 339/136 M |
| 3,932,016 | 1/1976 | Ammenheuser | 339/75 MP |
| 4,001,711 | 1/1977 | Knutson et al. | 330/66 |

Primary Examiner—John McQuade
Attorney, Agent, or Firm—Cushman, Darby & Cushman

[57] ABSTRACT

A hybrid circuit module for the modular system constructions of electronic equipment. The module includes a socket that is soldered to a printed wire board and includes a grounding strip and electrical contact terminals. A hybrid circuit fabricated on a ceramic substrate fits within a plastic guide which in turn is fitted to the socket. A plurality of contact pads on the hybrid circuit make electrical contact with the terminals of the socket. A shield can is fitted over the plastic guide and hybrid circuit.

5 Claims, 3 Drawing Figures

PLUG-IN CERAMIC HYBRID MODULE

BACKGROUND OF THE INVENTION

This invention relates in general to hybrid circuits used in the construction of radio equipment and the like. More specifically, this invention relates to packaging and interconnect systems used in the fabrication of hybrid circuits.

The use of ceramic substrate thick and thin film hybrid circuits is becoming more and more widespread in the radio communications industry. Such circuits generally are used in the construction of subsystems that are electrically connected with other such systems and/or conventional components placed on printed wire boards (PWB).

Hybrid circuits are formed on a ceramic substrate. Various components, such as capacitive and resistive elements are "painted" onto this substrate using silver poladium or some other "ink" forming a conductive or semiconductive layer. For capacitive elements a dielectric layer is "painted" between two conductive layers. The size of the layers, spacing and dielectric properties determine the capacitance of the element. In addition, lumped parameter conventional components such as resistors, chip capacitors, and inductors may form part of the circuit, hence the term "hybrid".

As the radio spectrum becomes more crowded and frequency tolerances become more severe; and as radio equipment becomes more sophisticated, there is an increasing need for a packaging system that can protect their delicate ceramic substrate and the electrical components mounted and painted thereon while providing a high degree of radio frequency (RF) interference shielding to meet the performance requirements of radio communication equipment. In addition, it is highly desirable to provide a circuit interconnection system allowing the quick and easy substitution of one ceramic hybrid circuit for another.

A known hybrid circuit packaging arrangement is shown in U.S. Pat. No. 4,001,711—Knutson et al, incorporated herein by reference. This is a high power level circuit and includes pins that are soldered directly to a printed wire board when the hybrid circuit is installed. Although such solder interconnection may be required for high power circuits requiring heat dissipation through the pins, this known packaging arrangement is inappropriate for most small signal applications. The use of solder in terminals is unnecessarily restrictive, both in initial assembly of a piece of radio equipment and in servicing it.

SUMMARY OF THE INVENTION

Therefore, the present invention provides a packaging arrangement particularly suitable for small signal ceramic hybrid circuits requiring a high degree of RF shielding.

The packaging arrangement provides not only physical protection and RF shielding for the hybrid circuit, but also provides a "plug-in" module construction. One or more plug-in modules can be mounted on a PWB. If a module must be tested or replaced, it can be easily unplugged and a new one substituted therefore, as necessary.

The hybrid module according to the present invention includes four main elements: a socket, permanently soldered to a printed wire board; a plastic guide interconnecting with the socket and having a pair of grooves to accommodate the edges of a ceramic substrate; the ceramic substrate hybrid circuit itself which slides into the grooves of the plastic guide (the edges of the substrate slide into the grooves); and a shield can surrounding the hybrid circuit and the plastic guide and interconnecting with terminals provided on the socket, the shield can completely enclosing hybrid circuit. The hybrid circuit includes a plurality of contact pads which interconnect with terminals provided in the socket.

To substitute one hybrid circuit for another, it is only necessary to remove the shield can and lift the plastic guide and hybrid circuit from the socket. The hybrid circuit can then be slipped out of the grooves of the plastic guide and another hybrid circuit substituted therefore into the plastic guide. The plastic guide and the new hybrid circuit can then be reinserted into the socket and the shield can replaced.

BRIEF DESCRIPTION OF THE DRAWINGS

The invention, defined by the appended claims, will be described in greater detail with respect to the accompanying drawings wherein:

DETAILED DESCRIPTION OF THE PREFERRED EMBODIMENT

Figure 1:
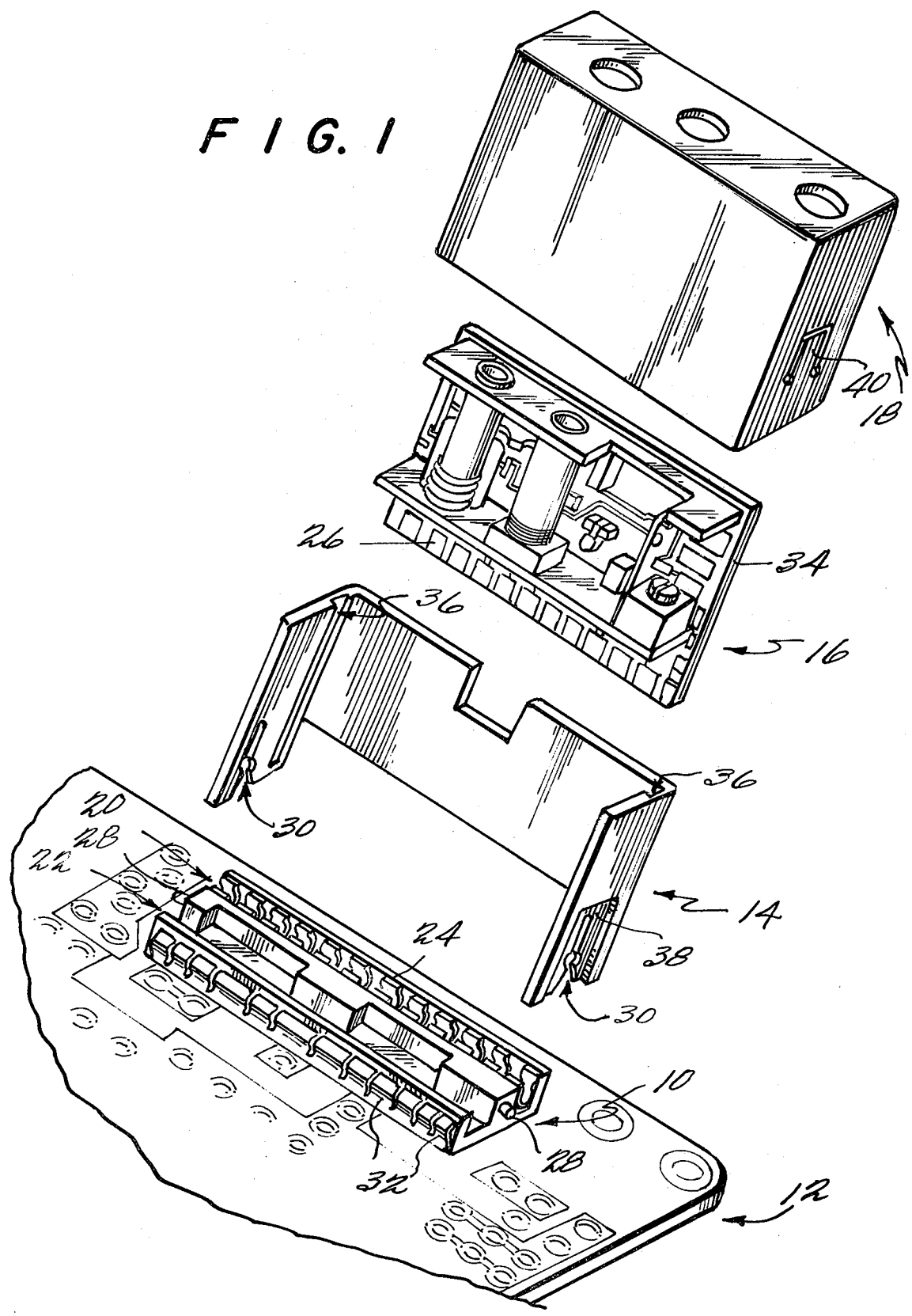
FIG. 1 is an exploded perspective view of the plug-in ceramic hybrid module according to the present invention.

Referring now to FIG. 1 there is shown an exploded perspective view of the plug-in ceramic hybrid module according to the present invention. The module includes four main elements: a socket 10 which, upon installation, is soldered into a printed wire board 12; a plastic guide 14; a hybrid circuit 16, and a shield can 18.

Socket 10 is fabricated from a plastic material and has two channels 20 and 22 formed therein. In at least one of the channels there is deposed a plurality of U-shaped pressure terminals 24 for receiving corresponding contact pads 26 formed on the ceramic substrate of hybrid circuit 16. On each end of socket 10 is a plastic pin 28 adapted to mate with a groove 30 formed in each side of plastic guide 14. Socket 10 includes a bracket 32 running along the bottom and both elongated sides thereof. This bracket is electrically interconnected with a ground printed wire on printed wire board 12. The edges of bracket 32 running along the elongated sides of socket 10 are cut and contoured so that shield can 18 pressure fits over the grounded bracket and makes good electrical contact therewith. Thus, when shield can 18 is fitted over socket 10, it makes electrical contact with bracket 32 for the entire length of both the front and back edges of the socket. This arrangement provides a very low resistance connection bringing shield can 18 to ground potential.

Hybrid circuit 16 includes a ceramic substrate 34 on which are formed contact pads 26 force-fit for interconnection with terminals 24. Plastic guide 14 is provided with a pair of grooves 36 having a width slightly larger than the thickness of substrate 34. This allows hybrid circuit 16 to be inserted within plastic guide 14 from the top thereof. After hybrid circuit 16 is slid into grooves 36, the hybrid circuit and plastic guide are applied to socket 10. To insert hybrid circuit 16 and plastic guide 14 into socket 10, the contact pads 26 of the hybrid circuit are inserted into the corresponding terminals 24 within the socket and groove 30 is forced around pins 28 of the socket.

Plastic guide 14 also includes a recessed portion 38 surrounding groove 30. Recess portion 38 is adapted to accommodate a cutout 40 positioned on each side of shield can 18. After hybrid circuit 16 and plastic guide 14 are inserted into socket 10, shield can 18 is lowered over the hybrid circuit and plastic guide. Cutout 40 which is bent toward the interior of shield can 18 becomes wedged within recessed 38 to secure the shield can to the plastic guide. As already stated, the bottom portion of shield can 18 forms a firm contact with bracket 32 of socket 10. This brings shield can 18 into good electrical contact with the ground plane of the printed wire board. As shown in FIG. 1, shield can 18, in this particular circuit module embodiment, is provided with three (3) holes in the top thereof. These holes provide access to adjustable components by a tuning tool. The holes do not form a part of the invention.

Figure 2:
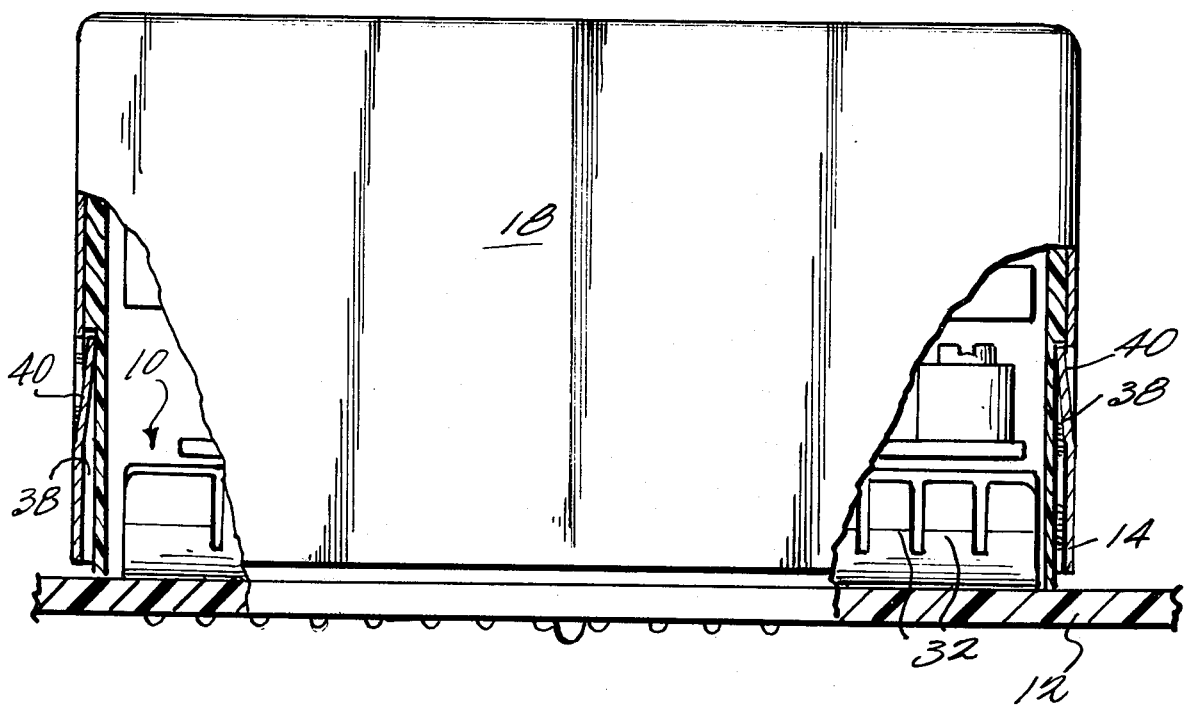
FIG. 2 is a cutaway front view of the plug-in ceramic hybrid module interconnected with a printed wire board.

Referring now to FIG. 2 there is shown a partially cutaway front view of the hybrid circuit module according to the present invention. In this view, socket 10 is soldered to printed wire board 12 and the hybrid circuit is in place. Shield can 18 makes contact with ground terminal 32. Cutout 40 is shown secured within recess 38 of plastic guide 14. To remove shield can 18, it is only necessary to pull evenly in a vertical direction with sufficient force to disengage the force fit with socket 10 and bracket 32. To remove hybrid circuit 16 from shield can 18, it is necessary to disengage cutout 40 from recess 38 in plastic guide 14 which then allows easy withdrawal of the hybrid circuit and plastic guide from the shield can 32.

Figure 3:
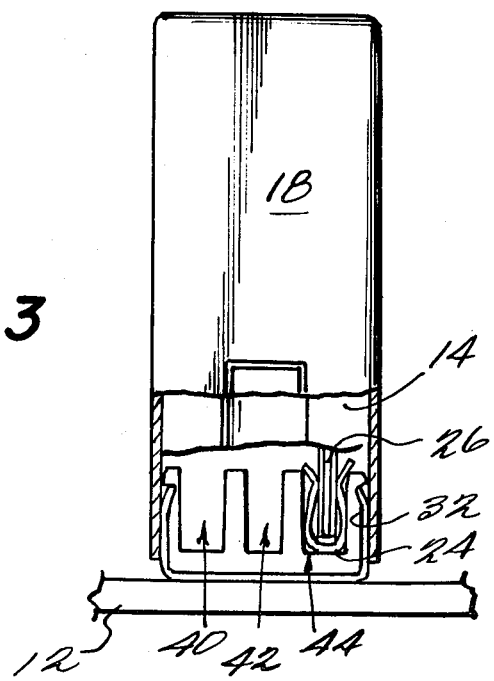
FIG. 3 is a partially cutaway side view of the plug-in ceramic hybrid module according to the present invention.

Referring now to FIG. 3 there is shown a partially cutaway side view of the hybrid circuit module according to the present invention. This view illustrates an alternate embodiment for socket 10 including three channels 40, 42 and 44 substituted for the two channels 20 and 22 shown in the FIG. 1 embodiment. Of course, the invention is not limited to any particular number of channels and the FIG. 3 embodiment is shown merely as one possible alternative. In this cutaway side view, terminals 24 are more clearly shown capturing a contact pad 26 of hybrid circuit 16. Also, the electrical contact between shield can 18 and ground terminal 32 is more clearly visible.

A thin layer of insulating material can be provided between bracket 32 and the upper surface of printed wire board 12. This insulating layer can serve as a solder flux shield when socket 10 is soldered to printed wire board 12 and as a preventive for the shorting of electrical runs on the printed wire board to the ground strip. Of course, bracket 32 is electrically connected with a ground strip of printed wire board 12.

While the invention has been described in connection with what is presently considered to be the most practical and preferred embodiments, it is to be understood that the invention is not to be limited to the disclosed embodiments but on the contrary is intended to cover various modifications and equivalent arrangements included within the spirit and scope of the appended claims which scope is to be accorded the broadest interpretation so as to encompass all such modifications and equivalent structures.

What is claimed is:

1. A hybrid circuit module for use with a printed wire board, comprising:
    a circuit including a substrate and various circuit components thereon, said circuit including a plurality of contact pads formed on said substrate providing input and output connections for said circuit,
    a socket, adapted for connection at a first side thereof to a printed wire board and on a second side thereof for receiving said circuit, including on said second side a plurality of metallic terminals for mechanically grasping the ceramic substrate and making electrical connection with the contact pads thereof;
    a plastic retainer having a pair of grooves therein for receiving two sides of said substrate and a latch groove on a side thereof; and
    a can for surrounding and shielding said circuit, having a latch therein for mating with said latch groove, said can being electrically connected with said printed wire board through said socket.

2. A hybrid circuit module according to claim 1 wherein said socket includes a grounding bracket having contact fingers on each side thereof for making electrical contact with the interior walls of said can when said can is fitted over said socket.

3. A hybrid circuit module according to claim 1 or claim 2 wherein said circuit is a hybrid thick film circuit.

4. A hybrid circuit module according to claim 1 or claim 2 wherein said circuit is a hybrid thin film circuit.

5. A hybrid circuit module according to claim 1 wherein said socket includes an elongated element on two sides thereof and wherein said plastic retainer includes a groove adapted to receive said elongated element for force fitting said plastic retainer to said socket.

* * * * *